US009952453B2

(12) United States Patent
Fainman et al.

(10) Patent No.: US 9,952,453 B2
(45) Date of Patent: Apr. 24, 2018

(54) BROADBAND METACOAXIAL OPTICAL NANOANTENNAS BASED ON PLASMONIC MODES

(71) Applicant: The Regents of the University of California, Oakland, CA (US)

(72) Inventors: Yeshaiahu Fainman, San Diego, CA (US); Alexei Smolyaninov, San Diego, CA (US); Lin Pang, San Diego, CA (US); Lindsay Freeman, San Diego, CA (US); Maxim Abashin, San Diego, CA (US)

(73) Assignee: The Regents of the University of California, Oakland ( * ) Notice: Subject to any disclaimer, the term of this patent is extended or adjusted under 35 U.S.C. 154(b) by 0 days.

(21) Appl. No.: 15/179,930

(22) Filed: Jun. 10, 2016

(65) Prior Publication Data

US 2017/0010483 A1  Jan. 12, 2017

Related U.S. Application Data

(60) Provisional application No. 62/173,872, filed on Jun. 10, 2015.

(51) Int. Cl.
*G02F 1/01* (2006.01)
*G02B 5/00* (2006.01)
(Continued)

(52) U.S. Cl.
CPC .......... *G02F 1/0102* (2013.01); *G02B 5/008* (2013.01); *G02F 1/0136* (2013.01); *H01L 23/12* (2013.01);
(Continued)

(58) Field of Classification Search
CPC ..... G02F 1/0102; G02F 1/0136; G02B 5/008; G02B 6/107; H01Q 1/36; H01Q 1/38;
(Continued)

(56) References Cited

U.S. PATENT DOCUMENTS 7,589,880 B2 *  9/2009  Kempa .................. B82Y 20/00
136/243
7,754,964 B2 *  7/2010  Kempa .................. B82Y 20/00
136/243

(Continued)

OTHER PUBLICATIONS

Fischer, H. et al., "Engineering the optical response of plasmonic nanoantennas", Opt. Express 16,12, 2008, pp. 9144-9154.
(Continued)

*Primary Examiner* — Loha Ben
(74) *Attorney, Agent, or Firm* — Perkins Coie LLP

(57) ABSTRACT

Techniques, systems, and devices are disclosed for implementing nanostructures in the optical domain that highly localize the incident electromagnetic field to with a large spectral range from the visible to the infrared range. An optical nano antenna device is provided to include a substrate; a central conductive core formed on the substrate; and a peripheral conductive shell formed on the substrate and located peripheral to the central conductive core to surround at least a part of the central conductive core. The central conductive core and peripheral conductive shell form a coaxial structure with a dimension less than an optical wavelength of light.

11 Claims, 4 Drawing Sheets

(51) Int. Cl.
*B82Y 20/00* (2011.01)
*H01Q 9/04* (2006.01)
*H01L 23/12* (2006.01)
*H01Q 1/38* (2006.01)

(52) U.S. Cl.
CPC ............. *H01Q 9/04* (2013.01); *H01Q 9/0407* (2013.01); *H01Q 1/38* (2013.01)

(58) Field of Classification Search
CPC ........ H01Q 9/04; H01Q 9/0407; H01L 23/12; H01L 23/14; H01L 23/147; H01L 31/0224; H01L 31/035227; H01L 31/09; H01L 35/00; B82Y 10/00; B82Y 20/00; B82B 3/00; B82B 3/0038
USPC ........ 359/245; 977/700, 701, 707, 949, 950, 977/953, 954; 250/338.4, 504 R; 136/243, 244, 249, 255; 343/700 R, 790, 343/791; 356/434
See application file for complete search history.

(56) References Cited

U.S. PATENT DOCUMENTS

| | | | |
|---|---|---|---|
| 7,943,847 B2* | 5/2011 | Kempa | ................. B82Y 20/00 136/243 |
| 8,431,816 B2* | 4/2013 | Kempa | ................. B82Y 20/00 136/244 |
| 8,785,855 B2* | 7/2014 | Darcie | ............... H01L 31/0224 250/338.4 |
| 9,360,509 B2* | 6/2016 | Naughton | ............. G01R 27/26 |
| 9,643,841 B2* | 5/2017 | Akyildiz | ............. B82B 3/0038 |

OTHER PUBLICATIONS

Novotny, L. et al., "Antennas for Light", Nat. Photon., 2011, pp. 83-90.

Smolyaninov, A. et al., "Broadband metacoaxial nanoantenna for metasurface and sensing applications", Opt. Express, 2014, pp. 22786-22793.

* cited by examiner

BROADBAND METACOAXIAL OPTICAL NANOANTENNAS BASED ON PLASMONIC MODES

CROSS REFERENCE TO RELATED APPLICATIONS

This patent application claims the benefit of U.S. Provisional Patent Application No. 62/173,872, filed on Jun. 10, 2015 entitled "BROADBAND METACOAXIAL OPTICAL NANOANTENNAS BASED ON PLASMONIC MODES". The entire content of the before-mentioned patent application is incorporated by reference as part of the disclosure of this application.

STATEMENT REGARDING FEDERALLY SPONSORED RESEARCH OR DEVELOPMENT

This invention was made with government support under grant no W911NF-11-C-0210 awarded by the Office of Naval Research. The government has certain rights in the invention.

TECHNICAL FIELD

This patent document relates to optical antenna technologies.

BACKGROUND

Optical nano-antennas are antennas with dimensions of less than the optical wavelength of the received light and operate to respond to the received light based on surface plasmon polaritons (SPP) to produce highly localized and enhanced electric fields at nanoscale, i.e., subwavelength "hotspots" around or at such optical nano-antennas. Optical nano-antennas can be used for converting EM radiation into confined/enhanced fields at or in a nanoscale structure for various applications for sensing, imaging, energy conversion and others.

SUMMARY

Techniques, systems, and devices are disclosed for implementing nanostructures in the optical domain that highly localize the incident electromagnetic field to "hotspots" with a significant local field enhancement and a field localization with a very large spectral range from the visible to the infrared range that has a wide spectral bandwidth, e.g., around or greater than 900 nm.

In one aspect, an optical nano antenna device is provided to include a substrate; a central conductive core formed on the substrate; and a peripheral conductive shell formed on the substrate and located peripheral to the central conductive core to surround at least a part of the central conductive core. The central conductive core and peripheral conductive shell form a coaxial structure with a dimension less than an optical wavelength of light.

In some implementations, the substrate is a dielectric substrate, and the central conductive core and the peripheral conductive shell include one or more metals. In some implementation, the peripheral conductive shell fully surrounds or encloses the central conductive core. In some implementations, the peripheral conductive shell partially surrounds or encloses the central conductive core to have an opening that breaks a coaxial symmetry of the peripheral conductive shell with respect to the central core. In some implementations, the peripheral conductive shell includes protruded structures extending towards the central conductive core to have a gap from central conductive core and, as an example, the central conductive core may have a dimension or radius of tens of nanometers, the peripheral conductive shell may have a dimension or radius of hundreds of nanometers, and the gap may be tens of nanometers.

In another aspect, an optical nano antenna device is provided to include a substrate; a dielectric layer formed over the substrate; a metal layer formed over the dielectric layer and patterned to include a central conductive core with a symmetric pattern around a center of the central conductive core, and a peripheral conductive structure located peripheral to the central conductive core and being separated from the central conductive core to surround at least a part of the central conductive core and structured in a way that the central conductive core and peripheral conductive structure form a nanoantenna with a dimension less than an optical wavelength of incident light to convert optical energy of incident light into localized electrical fields. In some implementations, the substrate and the dielectric layer can include silicon. In some implementations, an adhesive metal layer can be formed between the metal layer and the dielectric layer. Also, in some implementations, the peripheral conductive structure includes protruded structures extending towards the central conductive core to have gaps between tops of the protruded structures and central conductive core. In yet other implementations, the peripheral conductive structure includes an opening that breaks a coaxial symmetry of the peripheral conductive structure with respect to the central conductive core.

The above and other aspects and their implementations of the disclosed technology area described in greater detail in the drawings, the description and the claims.

BRIEF DESCRIPTION OF THE DRAWINGS

FIG. 2(a) shows FEM simulation results of field distribution for excited localized plasmon mode of MN showing strong field localization at the tip geometry of each inner prong. FIG. 2(b) shows numerical results showing spatial field localization of the MN; the 3 dB projection shows the FWHM crossection of the "hotspot". E field is localized to a spot with an area at FWHM of ~1 nm×2 nm. FIG. 2(c) shows numerical results of local field enhancement, $\alpha$ vs wavelength (optical frequency) of the excitation field for MN and other antennas with various gap sizes. The local field enhancement of the MN has a very broad spectral response. This is due to the characteristics from the coaxial geometry where numerous transverse modes are supported by the antenna giving rise to spectrally broad band operation. FIG. 2(d) shows numerical results of α for MN with left-handed and right-handed defects (see FIG. 1), showing asymmetric responses to excitation with optical fields prepared with clockwise and counterclockwise circular polarization states.

FIG. 3(a) shows a SEM image of MN with a gap of 14 nm. FIG. 3(b) shows an example of a MN with a left-handed defect. $R_E$=202 nm, $R_o$=133 nm, $R_i$=54 nm; θ=−27°, Δθ=32°. FIG. 3(c) shows an example of a MN with a right-handed defect. θ=27°, Δθ=34°.

FIG. 4(a) shows measurements of the fluorescence intensity performed on a sample with parallel arrays of bowties (BTs) and MNs. The inset image shows the fluorescence image at λ=814 nm, with scattered light λ<810 nm (including the 785 nm laser) filtered out. Further information regarding sample layout and experimental setup is available in the supplementary material. FIG. 4(b) shows measurements of the polarization dependence of MN with broken symmetry due to introduction of left-handed and right-handed defects. Polarization varied from left hand circular polarization through elliptical and linear polarizations to right hand circular polarization. Approximately 4 dB extinction ratio was achieved. Error bars represent one standard deviation. Renormalized numeric curves are added for comparison.

FIG. 5(a) shows the raw measurements and FIG. 5(b) show measurements normalized to the SiO2 background. Even while significantly off of the metacoaxial's peak resonance, and with three times fewer actual antennas per unit area then the bowties, the metacoaxial surface was clearly superior to that of the bowties for SERS.

DETAILED DESCRIPTION

Figure 1:
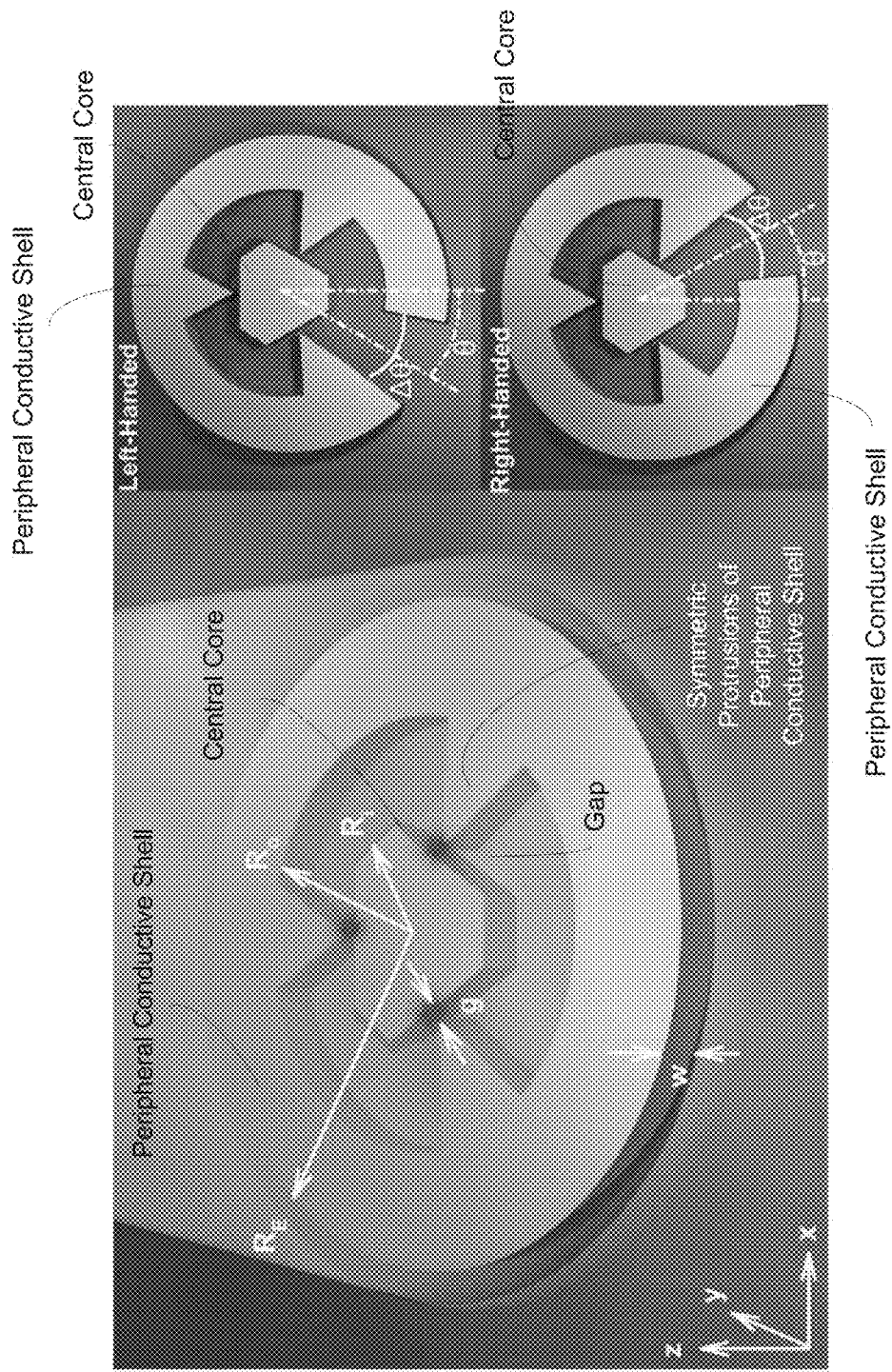
FIG. 1 shows an example of a metacoaxial nanoantenna based on the disclosed technology: Free space optical mode incident on the antenna excites a transverse resonance of the coaxial waveguide. The operation at optical frequencies leads to excitation of localized plasmon modes and the introduced tip geometry in the inner section of the MN leads to surface plasmon localization. Typical dimensions of the metacoaxial antenna are: radia $R_E$=200 nm, $R_o$=130 nm, $R_i$=55 nm; gap, g=10 nm-20 nm; thickness, w=20 nm. Inset: Defects defined by position, $\theta$=±26° and size $\Delta\theta$=31° are added to break the circular symmetry of the MN. MN left-handed defect (top) and right-handed defect (bottom) allow anisotropic field localization for incident radiation with clockwise and counterclockwise polarization states, respectively.

This patent document provides examples of a metacoaxial nanoantenna (MN) that super-localizes the incident electromagnetic field to "hotspots" with a top-down area of 2 nm$^2$, a local field enhancement of ~200-400, and a field localization with a very large spectral range from the visible to the infrared range that has a spectral bandwidth ≥900 nm. Not only is this nanoantenna extremely broadband with ultra-high localization, it also shows significant improvements over traditional nanoantenna designs, as the hotspots are re-configurable by breaking the circular symmetry which enables the ability to tailor the polarization response. These attributes offer significant improvements over traditional nanoantennas as building blocks for metasurfaces and enhanced biodetection that we demonstrate in this work.

With applications in various areas including spectroscopy, biosensing, imaging and metasurfaces, optical nanoantennas have experienced a surge in the field of plasmonics, with many interesting designs being utilized such as nanospheres, nanorod dimers, bowties, cross antennas, crescents and Yagi-Uda antennas.

Nanoantennas are commonly used for local field enhancement, α, defined by α=|E|/|E$_o$|, where |E| refers to the magnitude of the maximum localized electric field in the nanoantenna "hotspot" and |E$_o$| is the magnitude of incident field. The size of the hotspot is defined as the full-width half-maximum of the magnitude of the localized electric field. The spatial field localization is of great interest for numerous applications that rely on the strength of the field in a broad spectral range of operation including surface-enhanced Raman spectroscopy (SERS), fluorescence enhancement, enhanced performance of photovoltaic solar cells, and single molecule fluorescence detection. Additionally, a metasurface having metacoaxial nanoantennas could be used to make broadband ultrathin flat lenses and enhanced optical gradient trapping devices. For these applications, an ability to manipulate the response to the polarization state of the incident radiation is a very desirable property in a metasurface.

It has been difficult to configure a nanoantenna to address all of these considerations simultaneously. Various other nanoantennas tend to have optical characteristics that are highly dependent on excitation wavelength and geometric antenna dimensions (e.g. gap size). For example, a commonly used bowtie nanoantenna with a 10 nm gap, side length of 220 nm, and optimized for a wavelength of 780 nm can be designed to provide a local field enhancement on the order of α=150, but with a poor spectral response of α, as defined by the full width half maximum (FWHM) bandwidth of operation, that is only ~100 nm (i.e., fractional bandwidth of ~⅛).

This patent document describes a metacoaxial nanoantenna (MN) structure that simultaneously provides high field localization (α), operates in broad spectral range with fractional bandwidth greater than ½, and enables spatial localization (i.e., confinement) in a few nanometer range. Depending on its symmetry, the disclosed MN structure can possess either isotropic or anisotropic responses with respect to the polarization state of the incident optical field. As a specific design example, a coaxial design is shown to achieve a very wide spectral bandwidth by exploiting the inherent multimode behavior supported by coaxial waveguides and nanostructures. We break the circular symmetry of the design to achieve a high degree of control over its response to the polarization state of the incident radiation. We extend the metacoaxial design to localize the excited plasmonic mode inward along triangular prongs introduced into the coaxial geometry to create super-localized (2 nm$^2$) hotspots which leads to a higher α.

Figure 2:
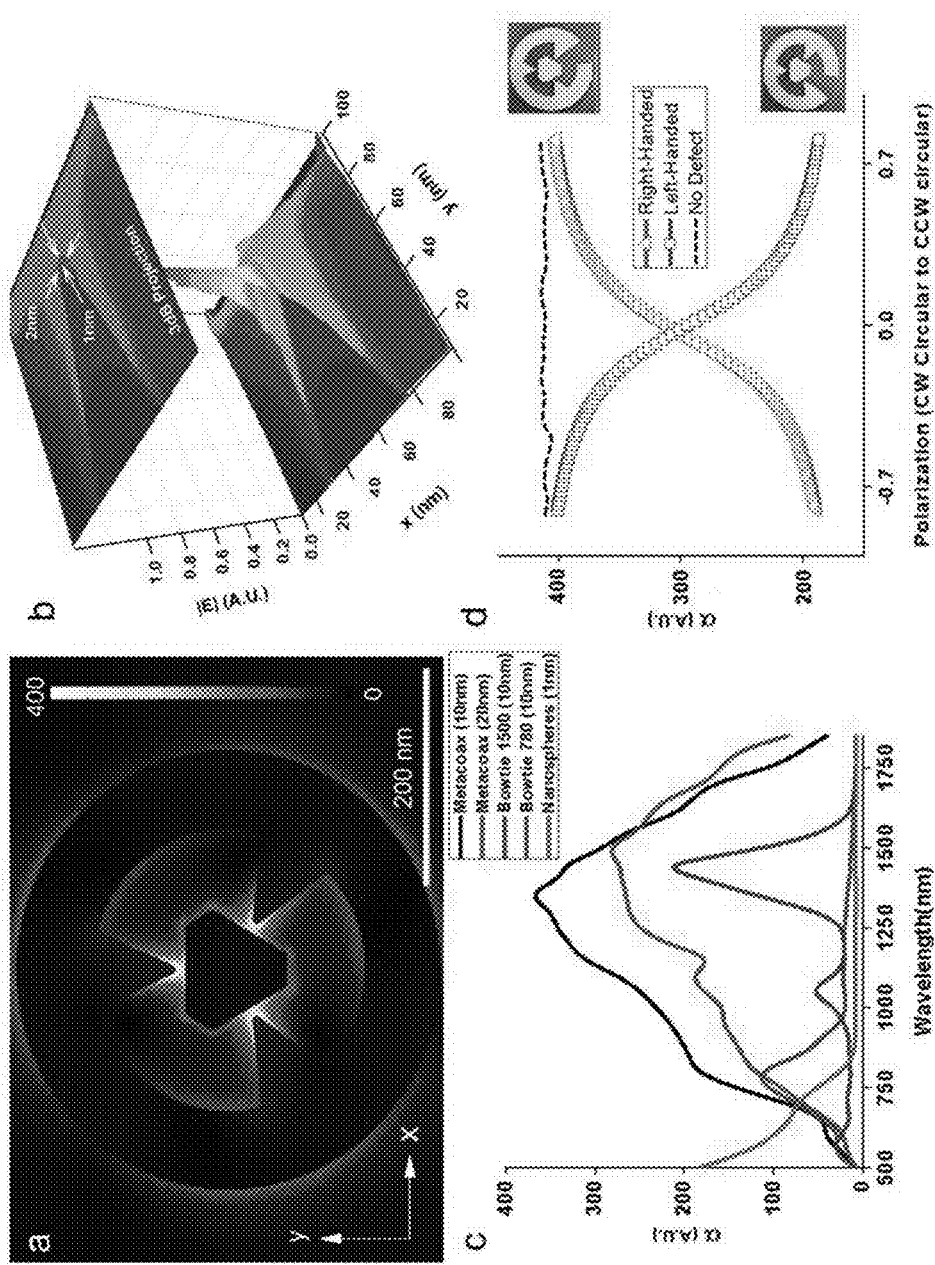
FIG. 2 includes FIGS. 2(a), 2(b), 2(c) and 2(d) showing examples of simulation results of a metacoaxial nanoantenna based on the design in FIG. 1.

For example, an optical MN device can include a substrate; a dielectric layer formed over the substrate; a metal layer formed over the dielectric layer and patterned to include a central conductive core with a symmetric pattern around a center of the central conductive core, and a peripheral conductive structure located peripheral to the central conductive core and being separated from the central conductive core to surround at least a part of the central conductive core and structured in a way that the central conductive core and peripheral conductive structure form a nanoantenna with a dimension less than an optical wavelength of incident light to convert optical energy of incident light into localized electrical fields. In some implementations, the peripheral conductive structure includes protruded structures extending towards the central conductive core to have gaps between tops of the protruded structures and central conductive core. In yet other implementations, the peripheral conductive structure includes an opening that breaks a coaxial symmetry of the peripheral conductive structure with respect to the central conductive core FIG. 1 shows a specific example of a MN device. The localized field enhancement and spectral response of a MN without defects are calculated via 3D finite element modeling (FEM) simulations, with illumination by a free space plane wave at normal incidence for gap (g) sizes of 10 nm and 20 nm (FIG. 2). The spatial localization of the incident electromagnetic field by the MN is shown in FIG. 2(b), with the electromagnetic field localized to an area of 2 nm². From these studies, we find that this "hotspot" area is independent of gap size for the MN (g=10 nm, 20 nm), which contrasts the results of typical dipole nanoantennas whose hotspots are directly dependent on the gap size. For comparison, a bowtie with a 10 nm gap might have a hotspot with an area (in the x-y plane) of 30 nm²–40 nm² whereas a MN with a larger 20 nm gap will still have a hotspot of around ~2 nm². Such extraordinary spatial field localization combined with the unusually large spectral range of operation shows a fundamentally novel behavior of our MN in comparison to a typical gap antenna, which exploit a narrowband dipole or quadrupole resonance to achieve its high field enhancement.

Preliminary results suggest that one possible reason for the reduced dependence of hotspot size on gap dimensions in the MN can be found in the fundamental $TEM_0$ coaxial mode. A metal-like coaxial structure can be designed to confine the electric field between the central, axial conductive core and the surrounding peripheral conductive shell. The presence of this field in a confined environment may enhance the localized surface plasmon modes within the device and on each of the prongs in the MN. This is a topic for further investigation.

Three-dimensional numerical modeling of metacoaxial and bowtie nanoantennas is based on a finite element method using Comsol Multiphysics version 4.2.0.150. The model uses a cylindrical computational space with a radius of 450 nm and a height of 300 nm. Perfectly matched-layer boundary conditions are used on all surfaces. The generated mesh has a minimum element size of 0.05 nm. A tip radius of 3 nm was used in the simulations. The simulations consist of gold antennas on $SiO_2$ substrate with excitation launched from the top of the simulation domain. Refractive indices for gold and $SiO_2$ at wavelengths of 550 nm to 2 μm are taken from E. D. Palik. *Handbook of optical constants of solids*. Vol. 3. Academic press, 1998, |E| is measured over the entire simulation space.

In order to evaluate the performance of the MN, we compared the MN to existing bowtie designs for a wavelength of 780 nm, both designs and field profiles are available in references. The field enhancement and localization of the bow tie antennas used as a comparison in this work are dependent on opening angle, arm length, gap size, and thickness. The bowties used have an arm length of 100 nm, a gap size of 10 nm, and an opening (or flare) angle of 70°, which is optimized to support a strong dipole resonance at a wavelength of 780 nm for a 20 nm thick Au Bowtie on $SiO_2$ based on prior characterization. These dimensions are chosen to support the strongest possible dipole resonance; increasing a particular dimension such as arm length compromises performance as it shifts the peak resonant wavelength. Since the MN does not operate on the principle of a dipole (or quadrupole) resonance, it is not subject to these same constraints.

The local field enhancement of the MN is numerically characterized across a wide range of wavelengths, from 550 nm to 1850 nm (FIG. 2(c)), showing peak field enhancements α varying from 200 to 370, for a gap size of 20 nm and 10 nm, respectively. The numerical analysis also shows that the MN exhibits field localization in a very large spectral range. For example, a design with a 10 nm gap supports a FWHM spectral range of 900 nm from λ=800 nm to λ=1700 nm (i.e., fractional bandwidth>½), as shown in FIG. 2(c). Subwavelength metal coaxial structures have been used as waveguides and thresholdless nanoscale lasers. The large spectral range of these nanocoaxial waveguides and our MN stems from shared characteristics with their larger RF coaxial counterparts.

To explain the unusual behavior of the introduced metacoaxial nanoantenna (MN), we review the general behavior of coaxial waveguides made of a perfect electric conductor (PEC) which possess a few interesting characteristics: first, the $TEM_0$ mode has no cutoff wavelength, $\lambda_c$; second, the $TE_{m1}$ mode has a cutoff proportional to the sum of the radii $\lambda_{cTEm1} \approx \pi(R_o+R_i)/m$ where $R_o$ and $R_i$ are the outer and inner radii (see FIG. 1). A similar cutoff wavelength exists for TM modes.

These characteristics are well understood in the RF domain, and have been shown to carry over to the optical domain for moderately lossy metals. Further, in a nanoscale coaxial waveguide at frequencies below the surface plasmon frequency, a nano-coaxial structure can support a plasmon polariton mode that resembles and qualitatively reduces to the conventional $TEM_0$ like mode of a conventional coaxial transmission line. $\lambda < \lambda_c$ the overall behavior of the coaxial transmission line will be the result of mode overlap of the TE, TM, and TEM-like modes, whereas at $\lambda > \lambda_c$, only the $TEM_0$ mode will be supported.

It is therefore not difficult to explain why our metacoaxial structure supports localization of radiation over such a wide spectral range: since the length of the waveguide in our MN geometry is extremely short (i. e., w=20 nm), the low refractive index dielectrics on both ends (substrate at the bottom and air on the top) act as plugs. These plugs create an impedance mismatch on both sides in the z-direction (see FIG. 1) which allows the free space radiation to couple more readily into the localized surface plasmon modes in the transverse x-y plane as opposed to the guided modes which normally propagate in a waveguide. These localized surface plasmon modes will be excited by free space modes from broad spectral bandwidth optical radiation ranging from frequencies with wavelengths at or below $\lambda_c$, as well as the wavelengths above $\lambda_c$ due to the supported $TEM_0$ mode. The tip geometry on each of the prongs causes high field localization of the localized surface plasmon modes.

Tests were conducted to investigate the effect of defects in the MN (see FIG. 3 and insets in FIG. 1) on the response to polarization state of the incident optical field, as breaking the symmetry leads to polarization dependence. By varying the orientation (θ) and the size (θΔ) of the defect, the antenna can be tailored to have an asymmetric field localization response to the excitation field prepared in a clockwise or counterclockwise circular state of polarization. Specifically, a MN with a left-handed defect (θ<0, θΔ=31°) will result in field localization of the incident clockwise circularly polarized light by 4 dB more than that that of the incident counterclockwise polarized light (see blue curve in FIG. 2(d)). Conversely, an MN with a right-handed defect (θ>0, θΔ=31°) will enhance localization of the incident counterclockwise circularly polarized light by 4 dB more than that of clockwise polarized light (see red curve in FIG. 2(d)). In contrast, based on conducted tests, a MN without a defect is nearly polarization insensitive as local field enhancement, α, varies by less than 1 dB as the state of polarization of the incident light is changed from circular to elliptical or linear.

Some samples were fabricated using electron beam lithography followed by liftoff. In conducted tests, a silicon substrate was used with a 500 nm layer of $SiO_2$ deposited using an Oxford Plasmalab 80 plus PECVD. Lithography was done using a Vistec EBPG5200 Electron Beam Writer on 100 nm thick spin coated film of PMMA C2. In fabricating testing samples, a 3-nm layer of Cr to ensure adhesion and a 20 nm layer of Au were deposited using a Temescal BJD 1800 Ebeam Evaporator.

Figure 3:
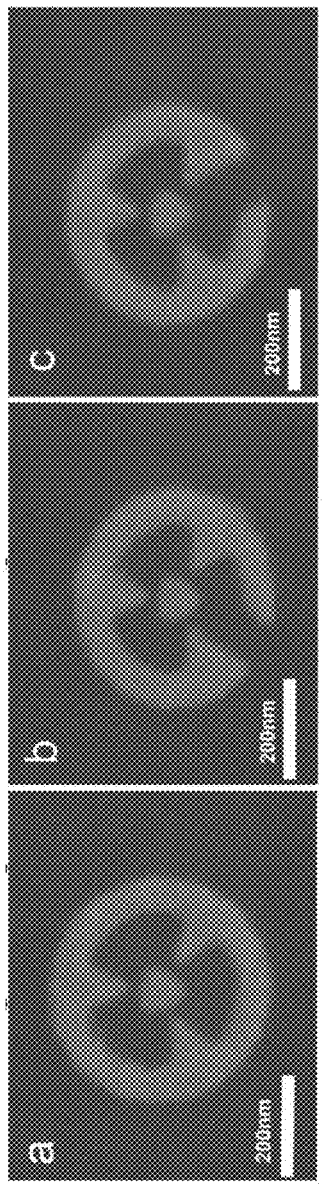
FIG. 3 shows SEM images of a metacoaxial nanoantenna based on the design in FIG. 1.

Examples of fabricated MNs include a 20 nm layer of Au on top of a 3 nm adhesion layer of Cr. The substrate is a silicon wafer with a 500 nm layer of SiO2. The scanning electron micrographs (SEMs) of the fabricated MNs are shown in FIG. 3. Characterization is performed using fluorescence enhancement in a spin coated layer of Alexa Fluor 790 dye in PMMA over the fabricated samples.

The metacoaxial antenna has an external radius $R_E$ of 200 nm, an outer radius $R_o$ of 130 nm and an inner radius $R_i$ of 55 nm (see FIG. 1). The fabricated antennas are designed with gaps ranging from 10 nm to 20 nm (see FIG. 1). The bowties are designed for a resonance wavelength around 785 nm, with each triangle having a length of 102 nm, a base width of 120 nm and a gap of 10 nm.

Characterization is performed using fluorescence enhancement in a spin coated layer of Alexa Fluor 790 dye in PMMA C2 over the fabricated samples. The measured intensity of the Alexa Fluor 790 dye emission is proportional to field amplitude. For illumination, a CW Titanium Sapphire laser operating at 785 nm with linear, elliptical, or circular polarization states is used, and the resulting fluorescence is observed using an Olympus BX61WI microscope and an SBIG ST-402me camera. Alexa Fluor 790 dye has an absorption maximum at a wavelength of 794 nm and an emission maximum at a wavelength of 814 nm. A dichroic filter which passes wavelengths longer than 810 nm is used to filter out scattered light at 785 nm, leaving only the fluorescence signal at 814 nm. To prevent photo bleaching and increase sample lifetime, the incident beam is attenuated to 2 mW/cm$^2$. It should be noted that we conduct this experiment off peak resonance for the metacoaxial antenna due to experimental constraints, as fluorescent dyes have excitation in the visible to NIR range.

For Raman measurements, a Renishaw Raman spectrometer with a resolution of 3 cm$^{-1}$ is used (integration time of 60 s). The excitation source is a 785 nm laser diode with an input power of ~1 mW. The software hyperSpec is used for baseline subtraction and cosmic ray removal. The density of bowties on the prepared sample is three times greater in order to have the same total number of hotspots per unit area for the bowties and metacoaxial antennas.

Figure 4:
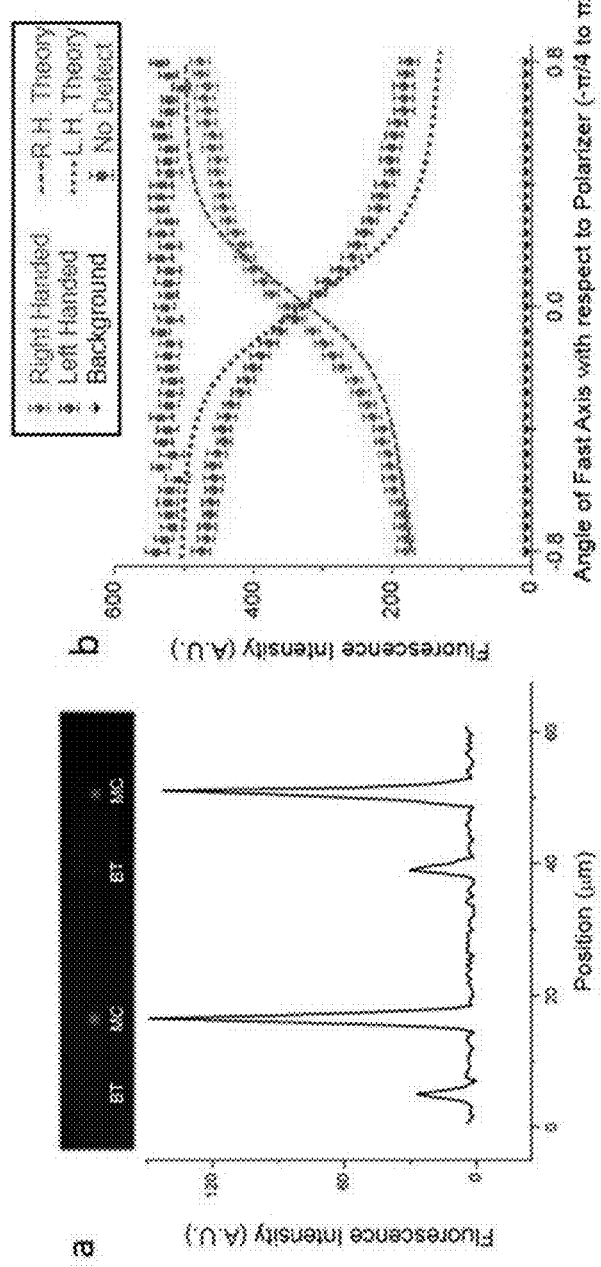
FIG. 4 shows examples of measurements of characteristics of the samples MNs in FIG. 3.

For comparison, bowties and MNs were fabricated as side by side arrays on the same sample. FIG. 4(a) shows a side by side fluorescence measurement of metacoaxial and bowtie antennas in an array; the MN has fluorescence intensity measurements approximately 5 times greater than that of the bowtie. Renormalizing for number of hotspots (note that the MN has 3 whereas bowtie has 1 hotspot) provides an α that is 1.6 times greater than that of the bowtie at λ=790 nm. This result is found in good agreement with computational models at the excitation wavelength of 785 nm (see FIG. 2(c)).

To test the polarization response, the symmetry of the outer ring of the MN is broken by adding defects (see FIG. 1 and FIG. 3(b)-3(c)). A 4-dB extinction in measured fluorescence is observed (see FIG. 4(b)) when the incident field polarization state from clockwise circular to counterclockwise circular is varied, allowing the corresponding antennas with left-hand and right-hand defects (see FIGS. 3(b) and 3(c)) to be switched on and off, respectively. These measured results are found in a good agreement with the theory (see FIG. 4(b) with numerical results from FIG. 2(c)). Since this effect relies on using circular polarizations, it is independent of sample orientation. This allows for different antennas on the same chip, and within the same diffraction limited area, to be selectively activated by varying the polarization state of the incident light from left-handed circular to right-handed circular.

Figure 5:
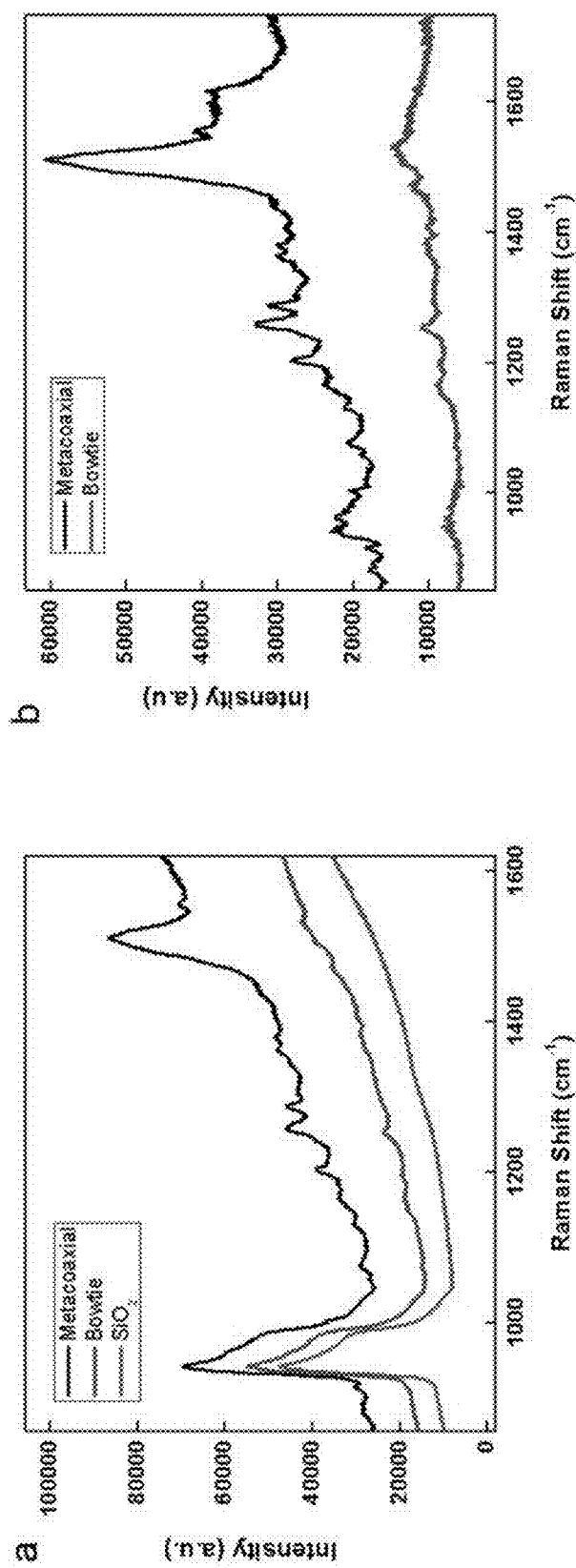
FIG. 5 shows examples of SERS measurements of metacoaxial and bowtie antennas with benzenthiol monolayer.

In order to demonstrate the improved local field enhancement of the MNs over traditional BTs, surface-enhanced Raman spectroscopy of a benzenethiol monolayer self-assembled onto the antennas is performed, showing enhanced Raman sensing by the MNs over the BTs (see FIG. 5). At an excitation wavelength of 785 nm, the MN (black line) shows superb enhancement compared to the bowtie antennas (blue line). The SERS intensities are normalized with respect to the SiO$_2$ background (red line) with the normalized Raman intensities of the MN and bowtie antennas shown in FIG. 5(b). Using the 1508 cm$^{-1}$ Raman mode of benzenethiol, the Raman enhancement is calculated to be 8.03 of MNs over bowties. This corresponds to a MN over bowtie α of 1.68 which is in good agreement with both the fluorescence enhancement measurement of 1.6 and the numerical models of FIG. 2(c). From the previous local field enhancement simulations, we expect the Raman enhancement to scale as α$^4$, with α=200 and thus a Raman enhancement of 1.6×10$^9$ at λ=785 nm.

The disclosed novel metacoaxial geometry nanoantenna has one of the largest optical spectral ranges (~1 μm) of any currently used high field enhancement nanoantenna, showing high potential for broadband metamaterial applications, such as optical gradient trapping and perfect absorbing solar cells. The MN is spatially super-localizing to ~2 nm$^2$, which offers great advantage in single molecule detection due to the inherently small detection volume and large interaction cross-section. The demonstrated tailorable polarization dependence (with 4 dB extinction) allows for specific antennas on a chip to be selectively activated by control of the circular polarization state of the incident free space mode, paving the way for a highly tailorable metamaterial surface. Significant fluorescence enhancement and Raman enhancement with MNs are also demonstrated experimentally. The fluorescence measurement shows an α (renormalized for number of hotspots) that was 1.6× higher than that of a bowtie at 785 nm and is in good agreement with the Raman measurements showing an α that is 1.68× higher than that of a bowtie. The MN presented in this paper combines super localization, tailorable polarization response, and broad spectral response into a single design.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. An optical nano antenna device, comprising:
   a substrate;
   a central conductive core formed on the substrate; and a peripheral conductive shell formed on the substrate and located peripheral to the central conductive core to surround at least a part of the central conductive core, wherein the central conductive core and peripheral conductive shell form a coaxial structure with a dimension less than an optical wavelength of light, and wherein the peripheral conductive shell includes protruded structures extending towards the central conductive core to have a gap from central conductive core.

2. The device as in claim 1, wherein:

the substrate is a dielectric substrate, and the central conductive core and the peripheral conductive shell include one or more metals.

3. The device as in claim 1, wherein the peripheral conductive shell fully surrounds or encloses the central conductive core.

4. The device as in claim 1, wherein the peripheral conductive shell partially surrounds or encloses the central conductive core to have an opening that breaks a coaxial symmetry of the peripheral conductive shell with respect to the central conductive core.

5. The device as in claim 1, wherein the central conductive core has a dimension or radius of tens of nanometers, the peripheral conductive shell has a dimension or radius of hundreds of nanometers, and the gap is tens of nanometers.

6. An optical nano antenna device, comprising:

a substrate;

a dielectric layer formed over the substrate; and a metal layer formed over the dielectric layer and patterned to include a central conductive core with a symmetric pattern around a center of the central conductive core, and a peripheral conductive structure located peripheral to the central conductive core and being separated from the central conductive core to surround at least a part of the central conductive core and structured in a way that the central conductive core and peripheral conductive structure form a nanoantenna with a dimension less than an optical wavelength of incident light to convert optical energy of incident light into localized electrical fields.

7. The device as in claim 6, wherein:

the substrate includes silicon; and the dielectric layer includes silicon.

8. The device as in claim 7, further comprising:

an adhesive metal layer formed between the metal layer and the dielectric layer.

9. The device as in claim 8, wherein:

the metal layer includes gold.

10. The device as in claim 6, wherein:

the peripheral conductive structure includes protruded structures extending towards the central conductive core to have gaps between tops of the protruded structures and the central conductive core.

11. The device as in claim 10, wherein:

the peripheral conductive structure includes an opening that breaks a coaxial symmetry of the peripheral conductive structure with respect to the central conductive core.

* * * * *